United States Patent
Feng et al.

(10) Patent No.: US 11,359,621 B2
(45) Date of Patent: *Jun. 14, 2022

(54) MINIATURE OPTICAL PARTICULATE MATTER SENSOR MODULE

(71) Applicant: Honeywell International Inc., Charlotte, NC (US)

(72) Inventors: Chen Feng, Snohomish, WA (US); Tao Chen, Charlotte, NC (US); Jennifer Liu, Charlotte, NC (US); Tong Shang, Denville, NJ (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/065,209

(22) Filed: Oct. 7, 2020

(65) Prior Publication Data

US 2021/0018421 A1    Jan. 21, 2021

Related U.S. Application Data

(63) Continuation of application No. 16/208,886, filed on Dec. 4, 2018, now Pat. No. 10,837,891.

(Continued)

(51) Int. Cl.
*F04B 45/047* (2006.01)
*G01N 15/06* (2006.01)
(Continued)

(52) U.S. Cl.
CPC .......... *F04B 45/047* (2013.01); *B81B 7/0038* (2013.01); *F04B 43/00* (2013.01);
(Continued)

(58) Field of Classification Search
CPC ........ F04B 43/00; F04B 45/047; F04B 43/02; F04B 33/00; B81B 7/0038;
(Continued)

(56) References Cited

U.S. PATENT DOCUMENTS 6,091,494 A    7/2000  Kreikebaum
6,494,090 B1   12/2002 Loesing et al.
(Continued)

FOREIGN PATENT DOCUMENTS

CN    103454194 A    12/2013
CN    103454914 A    12/2013
(Continued)

OTHER PUBLICATIONS

Dong, M. et al., "Silicon microfabrication based particulate matter sensor", Sensors and Actuators A: Physical, 2016, vol. 247, pp. 115-124.

(Continued)

*Primary Examiner* — Michael P Stafira
(74) *Attorney, Agent, or Firm* — Alston & Bird LLP

(57) ABSTRACT

Embodiments of the disclosure include a miniature optical PM sensor module. A miniature optical particulate matter sensor module may comprise a housing; a micro airflow generator positioned within the housing; an actuator positioned adjacent to the micro airflow generator and configured to drive the micro airflow generator; a miniature particulate matter sensor board assembly in fluid communication with the micro airflow generator; and a flex cable assembly configured to attach to at least one of the housing and the miniature particulate matter sensor board assembly.

19 Claims, 8 Drawing Sheets

Related U.S. Application Data

(60) Provisional application No. 62/597,210, filed on Dec. 11, 2017.

(51) Int. Cl.

| | | |
|---|---|---|
| *B81B 7/00* | (2006.01) | |
| *G01N 27/62* | (2021.01) | |
| *G01N 1/22* | (2006.01) | |
| *F04C 21/00* | (2006.01) | |
| *G01N 1/24* | (2006.01) | |
| *F04B 43/00* | (2006.01) | |
| *G01N 15/00* | (2006.01) | |

(52) U.S. Cl.
CPC ............ *F04C 21/00* (2013.01); *G01N 1/2273* (2013.01); *G01N 1/24* (2013.01); *G01N 15/06* (2013.01); *G01N 15/0606* (2013.01); *G01N 27/62* (2013.01); *G01N 2001/2285* (2013.01); *G01N 2015/0046* (2013.01); *G01N 2015/0693* (2013.01)

(58) Field of Classification Search
CPC .......... B81B 2201/0292; B81B 3/0072; G01N 15/06; G01N 30/02; G01N 2015/0046; G01N 2015/0693; G01N 30/06; G01N 1/2273; G01N 1/24; G01N 27/62; G01N 15/0606; G01N 2001/2285; G01N 15/1404; G01N 15/1459; G01N 15/1484; G01N 2015/1486; G01N 1/2813; G01N 1/31; G01N 2021/1793; G01N 2021/4709; G01N 2030/146; G01N 21/538; G01N 30/14; G01N 1/28; G01N 1/30; G01N 21/3504; G01N 21/45; G01N 2030/065; G01N 21/53; G01N 23/2202; G01N 30/74; G01N 33/0006; G01N 33/0032; G01N 33/569; G01N 1/2202; G01N 1/34; G01N 1/38; G01N 1/4077; G01N 15/08; G01N 15/10; G01N 15/14; G01N 2001/2223; G01N 2001/2279; G01N 2001/387; G01N 2001/4066; G01N 2015/0662; G01N 2015/084; G01N 2015/105; G01N 2021/3129; G01N 2021/3513; G01N 2030/062; G01N 2030/122; G01N 2030/128; G01N 21/314; G01N 25/18; G01N 25/20; G01N 25/68; G01N 27/125; G01N 27/129; G01N 30/08; G01N 30/12; G01N 30/7233; G01N 30/7273; G01N 33/0031; G01N 33/0057; G01N 33/0063; G01N 33/0075; G01N 33/227; G01N 33/4833; G01N 33/49; G01N 33/6848; G01N 35/0099; G01N 15/0205; G01N 1/26; G01N 21/84; G01N 33/00; G01N 33/0036; G01N 33/004; G01N 15/0211; G01N 2001/245; G01N 15/1434; G01N 33/0009; G01N 2015/1493; G01N 21/783; G01N 15/0255; G01N 2021/8578; G01N 21/85; G01N 33/0047; G01N 33/0062; G01N 2001/244; G01N 15/02; G01N 15/0618; G01N 2001/2276; G01N 2030/8813; G01N 21/01; G01N 21/49; G01N 25/72; G01N 30/00; G01N 33/0004; G01N 1/2205; G01N 15/0227; G01N 15/0266; G01N 15/0656; G01N 15/1012; G01N 15/12; G01N 2015/0026; G01N 2015/0687; G01N 21/05; G01N 21/31; G01N 27/223; G01N 33/0022; G01N 33/007; G01N 2021/7773; G01N 2033/4975; G01N 21/3151; G01N 21/75; G01N 21/78; G01N 2201/022; G01N 2201/0231; G01N 2201/061; G01N 2201/062; G01N 2201/068; G01N 2201/1211; G01N 29/00; G01N 31/225; G01N 33/0001; G01N 33/0037; G01N 33/0044; G01N 33/0054; G01N 33/0055; G01N 33/14; G01N 33/497; G01N 33/4972; G01N 33/84; G01N 1/2226; G01N 1/2247; G01N 2015/1075; G01N 2033/0068; G01N 2223/638; G01N 2223/641; G01N 2223/652; G01N 23/20; G01N 2333/43552; G01N 30/7206; G01N 33/0011; G01N 33/50; G01N 5/02; G01N 1/2214; G01N 1/405; G01N 15/0806; G01N 15/1429; G01N 19/10; G01N 2001/021; G01N 2001/022; G01N 2015/0038; G01N 2015/1454; G01N 2030/067; G01N 2030/642; G01N 21/4785; G01N 21/4788; G01N 21/8507; G01N 27/121; G01N 27/22; G01N 27/225; G01N 27/622; G01N 27/64; G01N 27/66; G01N 30/64; G01N 30/8658; G01N 33/0034; G01N 33/0039; G01N 33/0042; G01N 33/246; G01N 33/2847; G01N 1/2208; G01N 11/04; G01N 13/02; G01N 15/0625; G01N 15/1431; G01N 15/1463; G01N 15/147; G01N 15/1475; G01N 17/04; G01N 2001/002; G01N 2001/227; G01N 2013/0266; G01N 2015/0057; G01N 2015/0238; G01N 2015/1402; G01N 2015/144; G01N 2015/1497; G01N 2033/245; G01N 21/00; G01N 21/3518; G01N 21/766; G01N 21/94; G01N 2201/0221; G01N 2291/0215; G01N 2291/0237; G01N 2291/02845; G01N 2291/0422; G01N 2291/0427; G01N 25/56; G01N 27/041; G01N 29/02; G01N 29/036; G01N 29/04; G01N 29/222; G01N 33/0014; G01N 33/0026; G01N 33/0027; G01N 33/0073; G01N 33/025; G01N 33/28; G01N 33/30; G01N 33/36; G01N 33/362; G01N 7/00; G01N 7/10; F24F 2110/50; F24F 2110/65; G01F 5/00; G01F 1/00; G01F 13/006; G01J 1/0437; G01J 1/42; G01J 5/025; G01J 5/026; G01J 5/04

See application file for complete search history.

(56) References Cited

U.S. PATENT DOCUMENTS

| | | | |
|---|---|---|---|
| 6,967,338 | B1 | 11/2005 | Sickenberger et al. |
| 10,837,891 | B2* | 11/2020 | Feng ................. B81B 7/0038 |
| 2001/0035150 | A1* | 11/2001 | Daly ................. F02M 35/08 |
| | | | 123/198 E |
| 2005/0074340 | A1 | 4/2005 | Xu et al. |
| 2011/0277679 | A1* | 11/2011 | Good ................. G01N 1/2202 |
| | | | 116/202 |
| 2013/0157351 | A1 | 6/2013 | Ozcan et al. |
| 2014/0199181 | A1 | 7/2014 | Chappel |
| 2014/0356864 | A1 | 12/2014 | Khan |
| 2015/0153275 | A1 | 6/2015 | Park |
| 2016/0025628 | A1 | 1/2016 | Kim et al. |
| 2016/0231274 | A1 | 8/2016 | Tirapu Azpiroz |

(56) References Cited

U.S. PATENT DOCUMENTS

| | | |
|---|---|---|
| 2016/0282151 A1* | 9/2016 | Kursula ............. G01N 33/0047 |
| 2017/0030822 A1* | 2/2017 | Matsunami ........ G01N 15/1459 |
| 2017/0108425 A1 | 4/2017 | Dhaniyala et al. |
| 2017/0268994 A1 | 9/2017 | Kawai et al. |
| 2017/0370809 A1 | 12/2017 | Miller-Lionberg et al. |
| 2018/0217044 A1* | 8/2018 | Yang .................... G01N 21/534 |
| 2018/0242480 A1 | 8/2018 | Liu et al. |
| 2019/0145874 A1 | 5/2019 | Woolsey et al. |
| 2019/0178783 A1 | 6/2019 | Feng et al. |
| 2019/0187035 A1 | 6/2019 | Mou et al. |
| 2019/0293539 A1 | 9/2019 | Manautou et al. |

FOREIGN PATENT DOCUMENTS

| | | | | |
|---|---|---|---|---|
| CN | 106979910 A | 7/2017 | | |
| CN | 107305177 A | 10/2017 | | |
| EP | 3211338 A1 * | 8/2017 | ......... | B01D 46/0008 |
| JP | 2017166935 A * | 9/2017 | ................ | G01J 1/42 |
| WO | 2016/164733 A1 | 10/2016 | | |

OTHER PUBLICATIONS

International Search Report and Written Opinion received for PCT Patent Application No. PCT/US18/64918, dated Mar. 28, 2019, 9 pages.
Non-Final Rejection dated Dec. 10, 2019 for U.S. Appl. No. 16/208,886.
Notice of Allowance and Fees Due (PTOL-85) dated Apr. 8, 2020 for U.S. Appl. No. 16/208,886.
Notice of Allowance and Fees Due (PTOL-85) dated Jul. 15, 2020 for U.S. Appl. No. 16/208,886.
U.S. Appl. No. 16/208,886, filed Dec. 4, 2018, U.S. Pat. No. 10,837,891, Patented.

* cited by examiner

MINIATURE OPTICAL PARTICULATE MATTER SENSOR MODULE

CROSS-REFERENCE TO RELATED APPLICATIONS

This application is a continuation of U.S. patent application Ser. No. 16/208,886, filed Dec. 4, 2018, which claims priority to U.S. Provisional Patent Application Ser. No. 62/597,210, filed Dec. 11, 2017 by Chen Feng, et al. and entitled "Miniature Optical PM2.5 Sensor Module", each of which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

There has been an increased demand for miniaturized devices to detect and measure airborne particulate matter (PM). Airborne PM generally refers to a mixture of solid and liquid droplets suspended in the air. Exposure to particulate matter can be harmful to the health, as airborne PM can include pollutants, harmful chemicals, and the like. Particulates are divided generally into four categories by size. PM10 refers to particles less than 10 µm in diameter. PM2.5 refers to particles less than 2.5 µm in diameter. PM1.0 refers to particles less than 1 µm in diameter. PM0.1 refers to particles 100 nm or less in diameter, otherwise known as ultra-fine particles or nanoparticles. It is desirable to have a compact and reliable PM sensor to detect and monitor the level of PM in one's surroundings.

Existing miniature optical PM sensors typically use a fan to generate airflow for optical scattering particle detection. These fans tend to be bulky, noisy, unreliable, and have limited lifespans. Heaters have been used as alternatives to fans to generate airflow. A heater, however, is less efficient and has a lower flow rate than a fan and has a higher power consumption. And while a conventional pump may be used with large optical PM sensors (e.g. sized at least 10-times larger than miniature optical PM sensors) to generate reliable airflow, these pumps are generally too large and require too much power to work effectively for optical scattering particle detection in a miniature PM sensor. The power sources for such conventional pumps are not able to be reduced in size either easily or at all, for example as would be needed to create an optical PM sensor for use in a cell phone application.

Existing optical PM sensors are further limited by the light source. Existing optical PM sensors may rely on a focused light beam ambient or forward particle scattering. This technique requires a long optical path, a high-power laser input, a set of optics to focus the light field, and sensitive light detecting equipment to capture a signal. As a result, the sensor is large, expensive, and not easily scalable.

SUMMARY

In some embodiments, a miniature optical particulate matter sensor module may comprise a housing; a micro airflow generator positioned within the housing; an actuator positioned adjacent to the micro airflow generator and configured to drive the micro airflow generator; a miniature particulate matter sensor board assembly in fluid communication with the micro airflow generator; and a flex cable assembly configured to attach to at least one of the housing and the miniature particulate matter sensor board assembly.

In some embodiments, a method for generating airflow via a micro airflow generator within a compact optical scattering particulate matter sensor may comprise providing a miniature optical particulate matter sensor module comprising a housing; a micro airflow generator positioned within the housing; and an actuator positioned adjacent to the micro airflow generator and configured to drive the micro airflow generator; generating airflow into the housing via the actuator; directing the airflow into a miniature particulate matter sensor board assembly in fluid communication with the micro airflow generator; and detecting, by the miniature particulate matter sensor board assembly, particulate matter within the airflow.

DETAILED DESCRIPTION

Figure 1A:
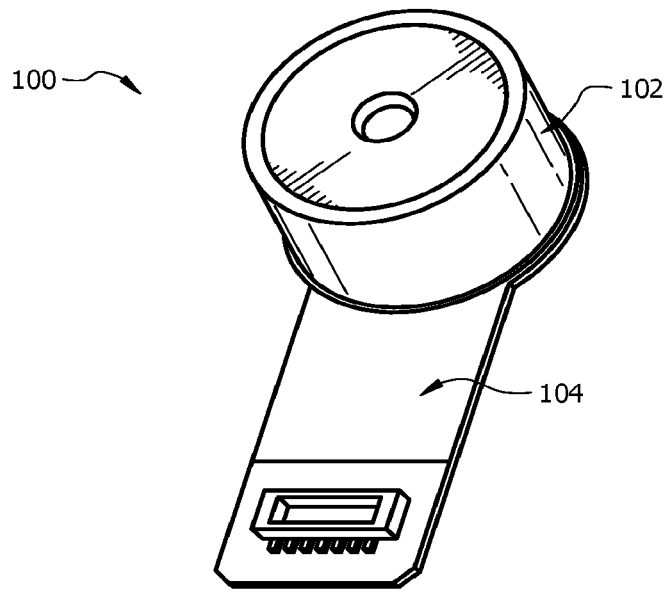
FIG. 1A illustrates a perspective view of an exemplary miniature optical PM2.5 sensor module according to an embodiment of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field (for example +/−10%); and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

The present disclosure relates generally to a system and apparatus for a miniature optical PM2.5 sensor module and assembly that is small enough to be used in a mobile (e.g. cell) phone application and which maintains optical scattering particle sensor accuracy and stability.

Embodiments of the disclosure generally describe a miniature/compact optical PM sensor module (e.g. a miniature optical PM2.5 sensor module) that is similar to the size and shape of a miniature camera module such as those widely used in mobile phones (although the exemplary compact/miniature optical PM2.5 sensor module is merely one example of a PM sensor module/element, and other compact/miniature optical sensor modules/elements could also be used in similar fashion—any reference to PM2.5 sensor hereinafter can refer to that specific sensor as an example or be understood as being used in the description as an example that could similarly allow for other compact/miniature PM sensors in substitution). Disclosed embodiments may describe a miniature optical PM2.5 sensor module with a micro airflow generator that uses induced movement of a membrane/diaphragm element to generate air flow (wherein movement of the membrane in turn induces movement in air). For example, a membrane or diaphragm element could be driven by an electronic actuator (or driver) element, such as a MEMS actuator element or piezo disc bender, piezo actuator, or voice coil motor (or some other means of vibrating/moving the membrane element in a way which induces airflow). In some embodiments, the electro-magnetic actuator, such as the MEMS actuator, may itself include a membrane (such that the electro-magnetic actuator might encompass the membrane and the electronic actuator element) and might serve as both the membrane/diaphragm and the electronic actuator element.

In some embodiments, such a micro airflow generator could be termed a micro membrane pump or micro pump, and any such pump might be used to achieve the desired air flow. Typically, a micro pump might comprise a pump diaphragm (such as a membrane element) driven by an actuator/driver (e.g. a means to induce movement of the corresponding membrane) which is configured to induce movement of the membrane element in a way that generates airflow out an outlet (which might be directed towards the optical scattering particle detection element, such as a miniature optical PM2.5 sensor module). In some embodiments, the micro membrane pump might comprise a deformable membrane plate, an air outlet check valve (typically located on the deformable membrane plate), a fixed air inlet plate, and an air inlet check valve (typically located on or with respect to the opening in the fixed air inlet plate). Typically, a micro airflow generator for use with a miniature optical PM2.5 sensor might provide outlet airflow flow rate in a range of 0.1 to 1 L/min. And typically, the power consumption for such a micro airflow generator might be 200 mW or less (for example a range of 100 to 200 mW) and/or the maximum noise generated by the micro airflow generator might be 20 dB or less (e.g. a range of 10 to 20 dB). And to work effectively for a miniature optical PM2.5 sensor, such micro airflow generator would typically be sized with a footprint of 100 $mm^2$ or less and/or a volume of 250 $mm^3$ or less.

Some disclosed embodiments may include a MEMS actuator that drives the micro airflow generator (for example by connection therebetween by an actuator coupler), thereby achieving significant size reduction and power consumption while retaining a reliable mechanism. Other disclosed embodiments may include a micro airflow generator with fixed check valves that are implemented on the inlet and outlet ports of the membrane. In an embodiment, the MEMS actuator drives the micro airflow generator (e.g. micro membrane pump) to provide an oscillating airflow which can be helpful in reducing dust accumulation on the laser diode die output surface.

Some embodiments of the disclosure would include a miniature optical PM2.5 sensor module that uses a simplified laser light source with a very short detecting distance. Disclosed embodiments describe a light source with a very small laser beam size (e.g. 2 μm at nominal wavelength 650 nm) comprising a direct diode laser beam, which for example typically does not use or interact with any optical component, such as an optical window, lens, or other focusing optics. The disclosed laser diode die has a well-defined output beam profile at the near field close to the diode output area. So, the original diode laser beam may be used without optically reshaping the beam profile (and eliminating the optical elements allows for further miniaturization without negatively impacting accuracy in a significant way). Disclosed embodiments may further include a photodiode to collect scattered laser light, which typically would be used without (e.g. not interact with) any collecting optics (again, aiding miniaturization). In some embodiments, the short collecting distance means the photodiode is highly efficient at collecting the scattered laser light. The high efficiency ensures that sufficient particulate matter is detected and counted for the sensor to operate properly, even at this small size and without the use of focusing optics. In some embodiments, a light trap may be present to collect stray scattered light and minimize stray light into the detection area, as well as a laser heat sink that provides thermal management for the laser diode die.

FIG. 1A shows a perspective view of an exemplary miniature optical PM2.5 sensor module 100 (although this exemplary sensor module is merely one example of a PM sensor module/element, and other compact/miniature optical sensor modules/elements could also be used in similar fashion). The miniature optical PM2.5 sensor module 100 may comprise a surface mount device (SMD) module 102 that is attached to (and typically in electrical and/or fluid communication with) a flex module/cable 104 (which, for example, may be configured to allow mounting/attachment to a mobile phone and/or to allow power and/or information/data to pass between the mobile phone and the SMD module) in this embodiment (although in other, similar embodiments, the SMD module might be instead used with mobile phone applications by directly reflow on the main board of the mobile phone). The flex cable 104, along with a board to board connector, can provide flexible integration into space limited mobile assemblies. The flex cable 104 may comprise communication of detected information from the SMD module 102 (and/or elements contained therein) to a user, possibly via a connection with a mobile device or mobile phone.

Figure 1B:
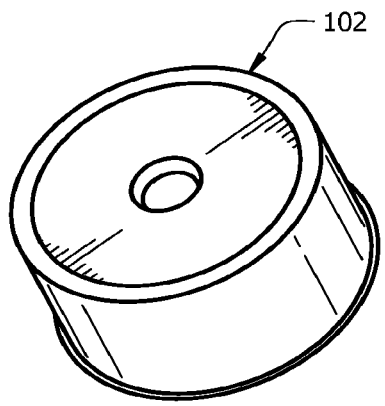
FIG. 1B illustrates a front perspective view of an SMD module of an exemplary miniature optical PM2.5 sensor module according to an embodiment of the disclosure.
Figure 1C:
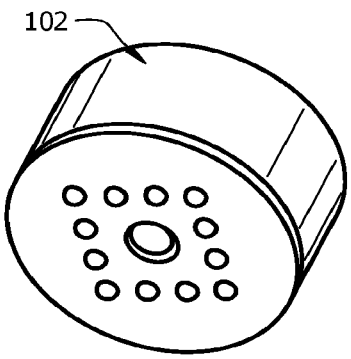
FIG. 1C illustrates a back view of an SMD module of an exemplary miniature optical PM2.5 sensor module according to an embodiment of the disclosure.

FIGS. 1B-1C show front and back perspective views of the SMD module 102. The miniature optical PM2.5 sensor module 100 of FIG. 1A when fully assembled (including the flex cable 104) is typically approximately 7 mm in diameter (e.g. less than 10 mm, less than 8 mm, or from 5-8 mm in diameter) and 3.9 mm in thickness (e.g. less than 4 mm or from 3-4 mm in thickness).

Figure 2A:
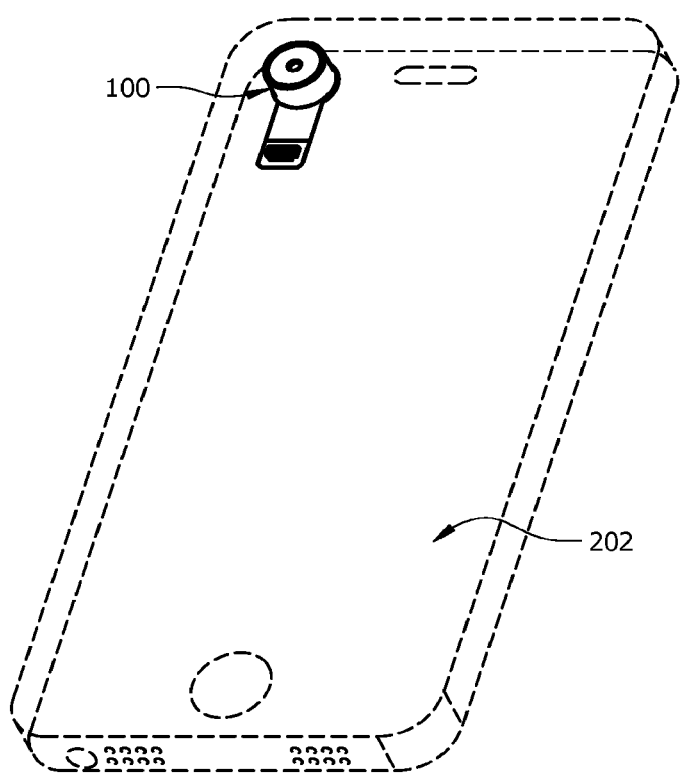
FIGS. 2A and 2B illustrate a perspective view and a side view of an exemplary miniature optical PM2.5 sensor module as input into a mobile device according to an embodiment of the disclosure.
Figure 2B:
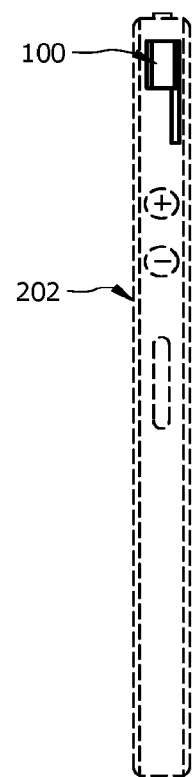

FIGS. 2A-2B illustrate a perspective view and side view of the miniature optical PM2.5 sensor module 100 of FIG. 1A that has been combined with or input into a cellphone 202 (or cellphone like application, or mobile device) according to an embodiment. FIGS. 2A-2B provide an understanding of the miniaturized nature of the miniature optical PM2.5 sensor module 100 and its potential applicability in devices due to its miniature size.

Figure 3:
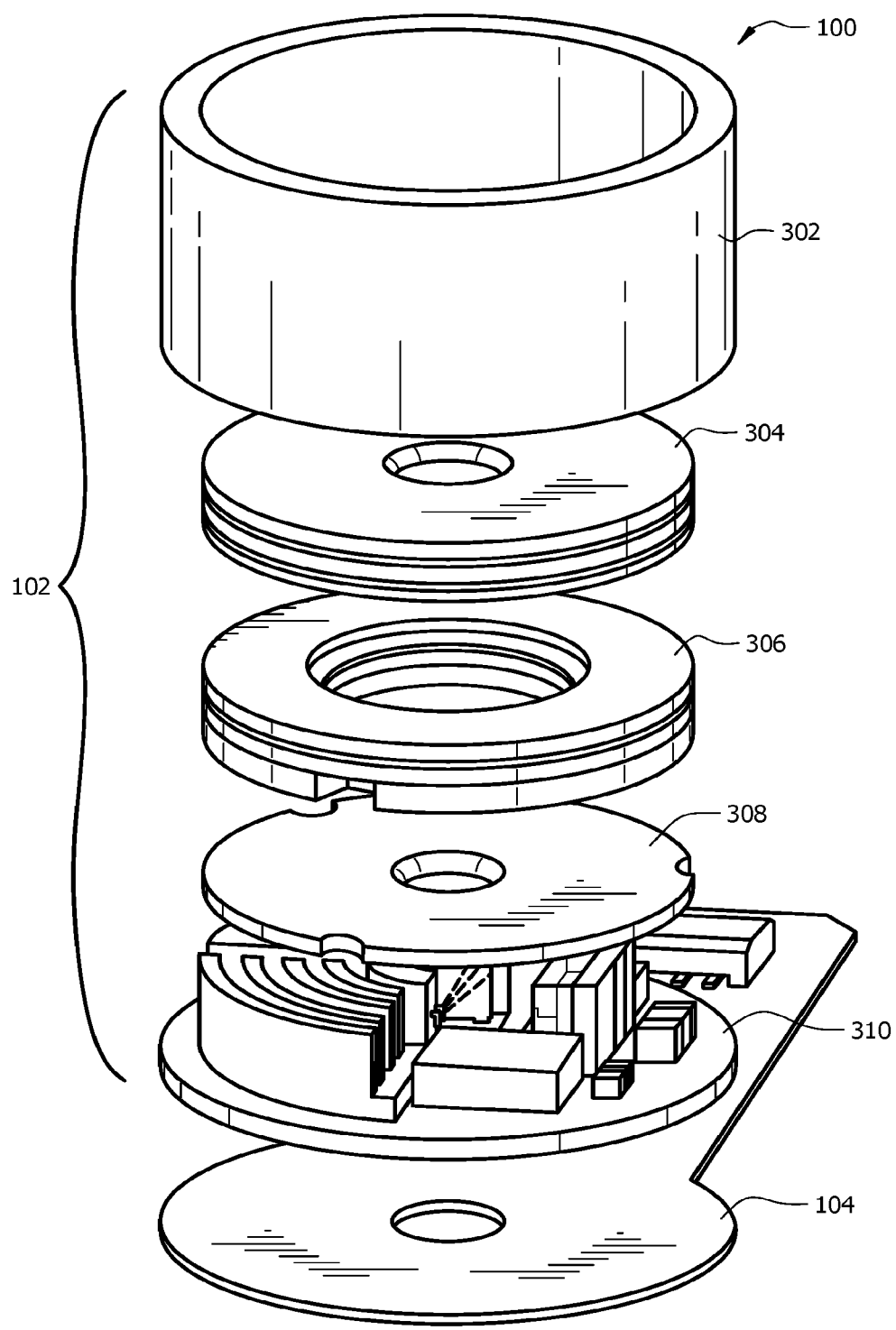
FIG. 3 is an exploded view of an exemplary miniature optical PM2.5 sensor module assembly, comprising a MEMS actuator, according to an embodiment of the disclosure.

FIG. 3 is an exploded view of the miniature optical PM2.5 sensor module 100 (although this exemplary sensor module is merely one example of a PM sensor module, and other compact/miniature optical sensor elements/modules could also be used in similar fashion). Miniature optical PM2.5 sensor module 100 of FIG. 3 may comprise a housing 302, a micro airflow generator 304, an actuator 306, an air inlet plate 308, a miniature PM2.5 sensor board assembly 310, and a flex cable assembly 104. In FIG. 3, housing 302 is cylindrical in shape. In fact, all of the components of SMD module 102 (shown in FIG. 1A) are circular and or cylindrical in shape. This cylindrical shape may permit the SMD module 102 to be manufactured easily by way of direct reflow on the main printed circuit board with surface mount technology processes. In some embodiments, the micro air flow generator 304 may comprise a membrane pump, also called a micro membrane pump, which is more fully described in FIGS. 5A-5C. In some embodiments, the actuator 306 may comprise an electronic actuator element such as a MEMS actuator, which is more fully described in FIGS. 6A-6C. In other embodiments the actuator 306 may be or may comprise a piezo (e.g. disc bender) actuator, a voice coil motor, or some other means to induce movement/vibration/oscillation of the micro airflow generator. The miniature PM2.5 sensor board assembly 310 embodiment is described more fully in FIGS. 7A-B and 8.

Figure 4:
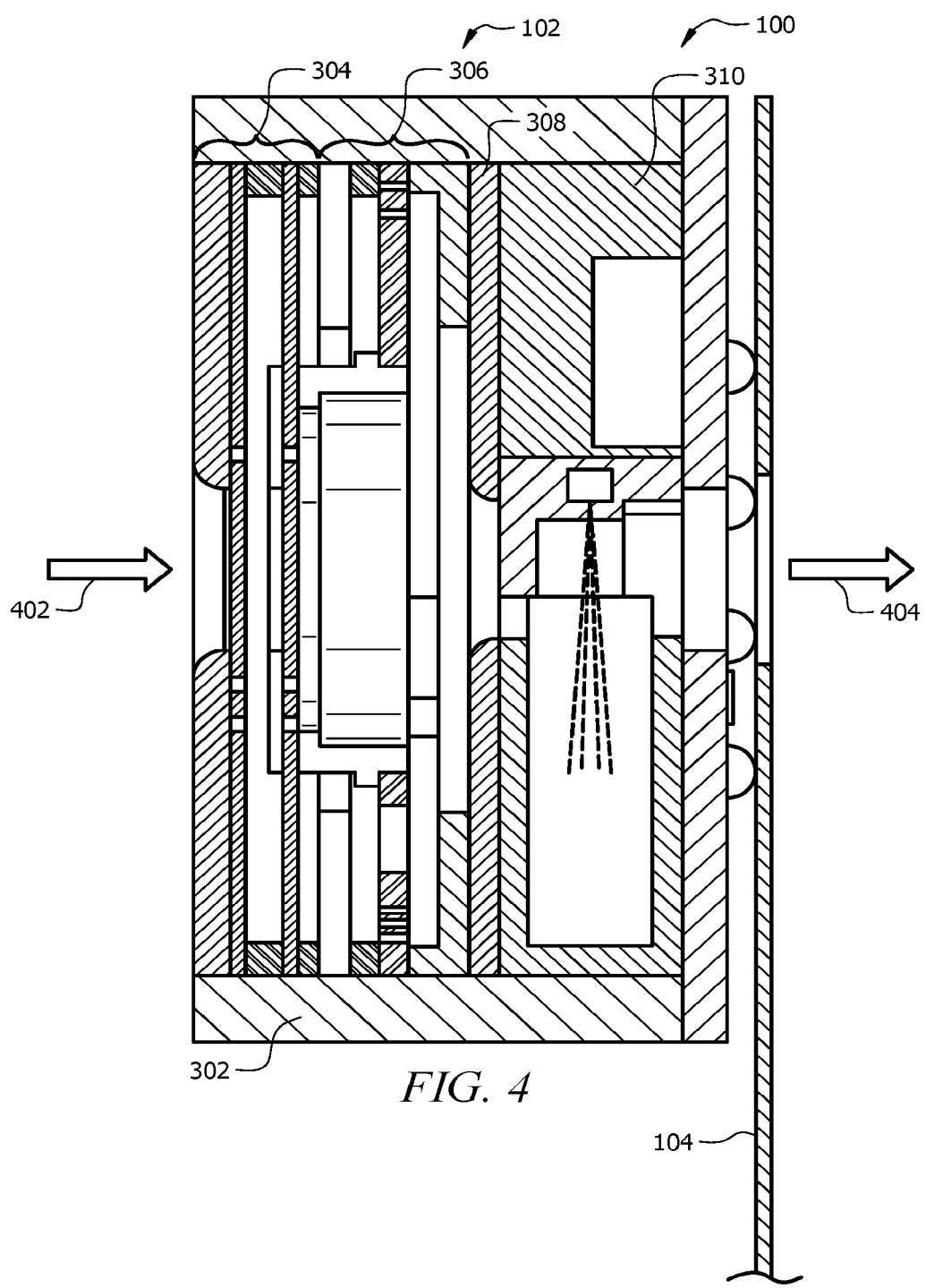
FIG. 4 illustrates a cross-sectional view of a fully assembled miniature optical PM2.5 sensor module, comprising a MEMS actuator, according to an embodiment of the disclosure.

FIG. 4 shows a cross section view of the miniature optical PM2.5 sensor module 100 (shown in FIG. 1), although this exemplary sensor module is merely one example of a PM sensor module, and other compact/miniature optical sensor elements could also be used in similar fashion. As FIG. 4 shows, the apertures/openings/holes (e.g. airflow openings) of the various elements are typically aligned, for example along a central axis of the device and/or with the aperture in the fixed air inlet plate aligned with the hole/opening/aperture in the MEMs actuator and the hole/opening/aperture in the laser scattering sensor board. Also, the attachment of the SMD module 102 to the flex module/cable 104 typically might provide spacing therebetween which may allow (further) outlet airflow (for example, in addition to or instead of airflow through an opening/hole/aperture in the flex module/cable). For example, solder might be used for the attachment, perhaps providing electrical and/or physical attachment/connection and/or a gap for additional air exit pathways. Generally during operation, air is drawn into the miniature optical PM2.5 sensor module 100 (e.g. at the distal end away from the mobile phone or point of attachment such as flex cable) in the direction of arrow 402 and exits the miniature optical PM2.5 sensor module 100 in the direction of arrow 404 and/or at the sides at the proximal end.

Figure 5A:
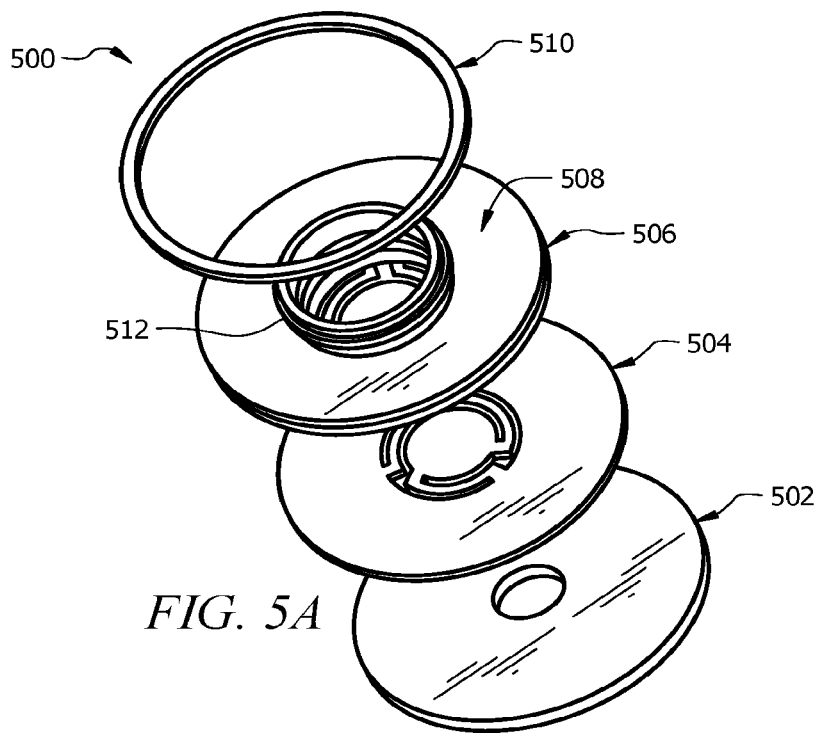
FIG. 5A is an exploded view of a micro membrane pump assembly according to an embodiment of the disclosure.
Figure 5B:
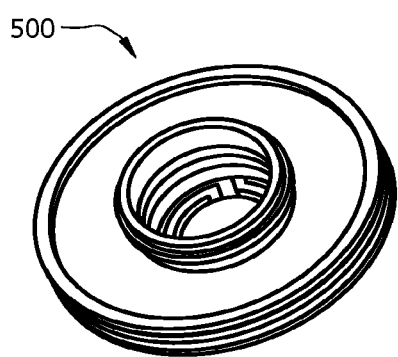
FIG. 5B is a perspective view of a fully assembled micro membrane pump according to an embodiment of the disclosure.
Figure 5C:
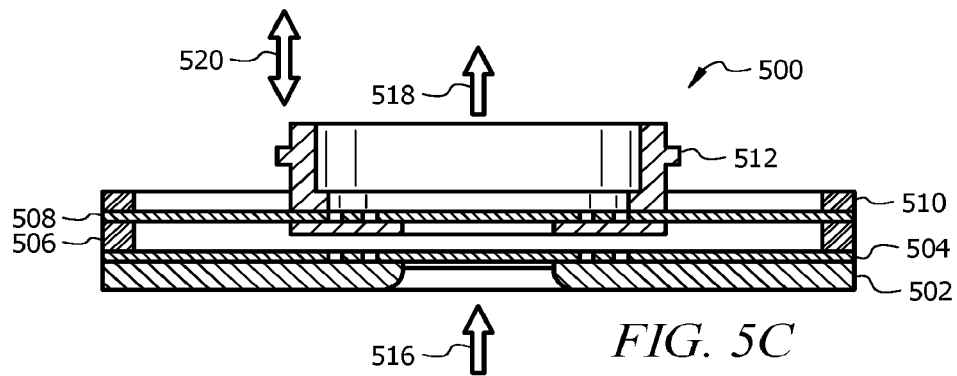
FIG. 5C is a cross-sectional view of a fully assembled micro membrane pump according to an embodiment of the disclosure.

FIGS. 5A-5C illustrate various views of a micro membrane pump 500 that is operating as the micro airflow generator 304 (shown in FIG. 3) in miniature optical PM2.5 sensor module 100. FIG. 5A shows an exploded view of the micro membrane pump 500 according to an embodiment. The micro membrane pump 500 of FIG. 5A may comprise a fixed (e.g. unmovable/unmoving with respect to the actuator/driver) air inlet plate 502 having an aperture (for example in its center); an air inlet membrane check valve 504; a deformable membrane plate 506 with an air outlet check valve 508 (typically located in the center of the deformable membrane plate 506); a sealing ring 510; and/or an actuator coupler 512 (configured to transfer movement from the actuator to the deformable membrane plate). FIG. 5B shows a perspective view of a fully assembled micro membrane pump 500. FIG. 5C shows a cross section view of a fully assembled micro membrane pump 500.

The air inlet check valve 504 in this embodiment is sandwiched between the fixed air inlet plate 502 and the deformable membrane plate 506. In operation (e.g. as driven by the actuator via coupling of the actuator coupler 512), air intake can occur through air inlet plate 502 (via an aperture) in the direction of the arrow 516 in FIG. 5C. Air is expelled from the micro membrane pump 500 of FIG. 5C through deformable membrane plate 506 with an air outlet 508 in the direction of the arrow 518. So, for example, in operation air might be drawn into the housing 302 via air inlet plate 502, for example by movement/vibration/pulsation of the deformable membrane plate 506 with an air outlet check valve 508 which creates a vacuum and draws air in through air inlet plate 502. Once air is drawn into the housing, the movement of the deformable membrane 506 may drive air out of the housing 302 through the outlet 508. So, the micro membrane pump 500 may consist of disc shape cell with deformable membrane supported top moveable plate. Built-in membrane check valves are typically located at the center of the bottom fixed plate and the center of the top moveable plate. By pressing and depressing the top moveable (e.g. deformable) plate, the air can be sucked into the cell (e.g.

micro membrane pump) through the bottom membrane valve (e.g. air inlet membrane check valve) and ejected out the cell through the top membrane valve (e.g. the air outlet check valve in the deformable membrane plate). In some embodiments, the micro membrane pump is powered by an actuator 306 which creates movement in the direction as shown at arrow 520.

Figure 6A:
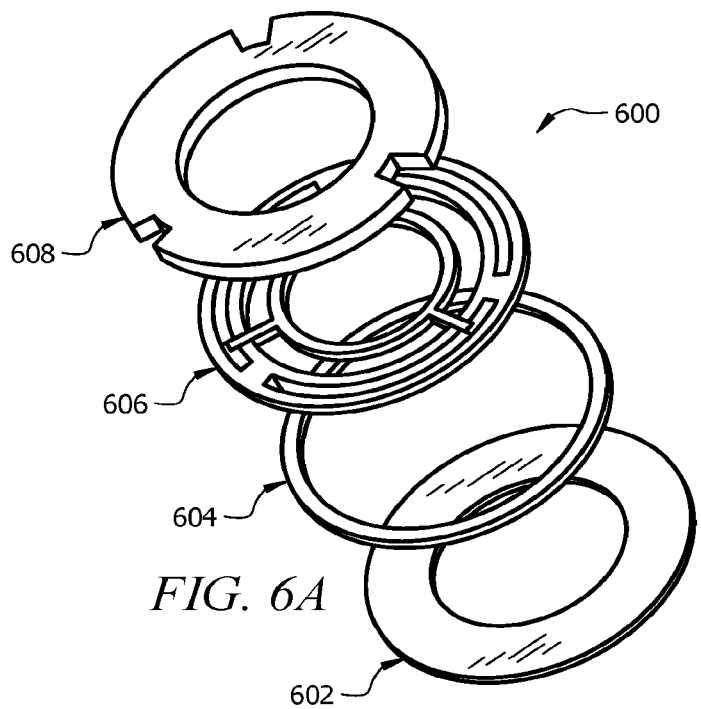
FIG. 6A is an exploded view of a MEMS actuator according to an embodiment of the disclosure.
Figure 6B:
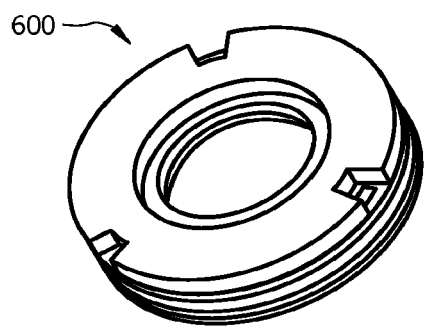
FIG. 6B is a perspective view of a fully assembled MEMS actuator according to an embodiment of the disclosure.
Figure 6C:
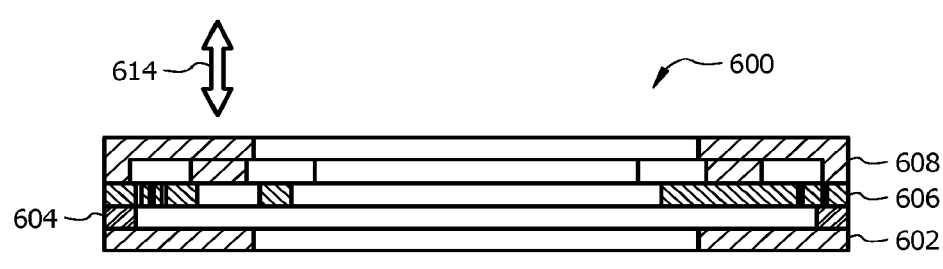
FIG. 6C is a cross-sectional view of a fully assembled MEMS actuator according to an embodiment of the disclosure.

FIGS. 6A-6C show various views of an exemplary actuator 306 (as shown in FIG. 3) according to an embodiment. MEMS actuator 600 can be seen in FIG. 6A which illustrates an exploded view. A MEMS actuator 600 may comprise a base plate 602; a MEMS substrate 604; a MEMS vertical motion comb drive actuator 606; and a top cover 608. FIG. 6B shows a perspective view of a fully assembled MEMS actuator 600. FIG. 6C shows a cross section view of MEMS actuator 600 and the direction of movement is as shown in arrow 614. As seen in FIG. 6B, the MEMS actuator 600 has a central aperture which aligns with the output airflow from a micro membrane pump through outlet check valve (as described above).

In some embodiments, the MEMS actuator 600 is configured to generate motion along an axis by way of three pairs of vertical motion comb drives (not shown in FIG. 6A). For example, a MEMS actuator such as is used in a camera lens autofocus can be used as the MEMS actuator 600. The actuation by such a MEMS actuator 600 might consist of a fixed outer frame and a moveable inner frame connected at the edges by double folded cantilever hinges. A vertical motion comb drive between the fixed outer frame and the moveable inner frame would then generate the force that moves the inner frame in and out along the center axis of the miniature optical PM2.5 sensor module 100.

In some embodiments, the MEMS actuator 600 can be manufactured by a silicon on insulator process or any other appropriate techniques used to create MEMS. Embodiments of the MEMS actuator 600 are typically sized to be approximately 6 mm in diameter and 1 mm in height. The footprint of the MEMS actuator 600 might be 28 $mm^2$ or less (for example, 25-28 $mm^2$, 26-28 $mm^2$, or 27-28 $mm^2$) and/or the three-dimensional (volume) size would be 28 $mm^3$ or less (for example, 25-28 $mm^3$ or 26-28 $mm^3$ or 27-28 $mm^3$).

Disclosed embodiments describe the movement of the MEMS actuator 600 as an oscillating motion. This oscillating motion generates an oscillating airflow that is configured in the miniature optical PM2.5 sensor module 100 (shown in FIG. 1) to pass through the center of the laser beam profile to carry particulate matter in the air into the path of the laser for scattering and detection. An advantage of an oscillating air flow is that dust accumulation may be reduced on dust sensitive surfaces, such as laser diode die surfaces. The oscillating vibration generated by the MEMS actuator 600 may have an additional benefit of cleaning the module by shaking off accumulated dust. The drive voltage of the MEMS actuator 600 further can create a static electric field that pulls dust away from electrically biased optical components on the miniature optical PM2.5 sensor module 100. Thus, the specific configuration of the present disclosed embodiments may be particularly advantageous.

Disclosed embodiments of the MEMS actuator 600 describe the characteristics of MEMS actuator 600 as having a payload of approximately 4 mg, a motion of approximately 100 μm, and/or the ability to absorb greater than 10,000 g of shock when installed in a cellphone. These characteristics are indicated to be much higher than other typical MEMS.

Figure 7A:
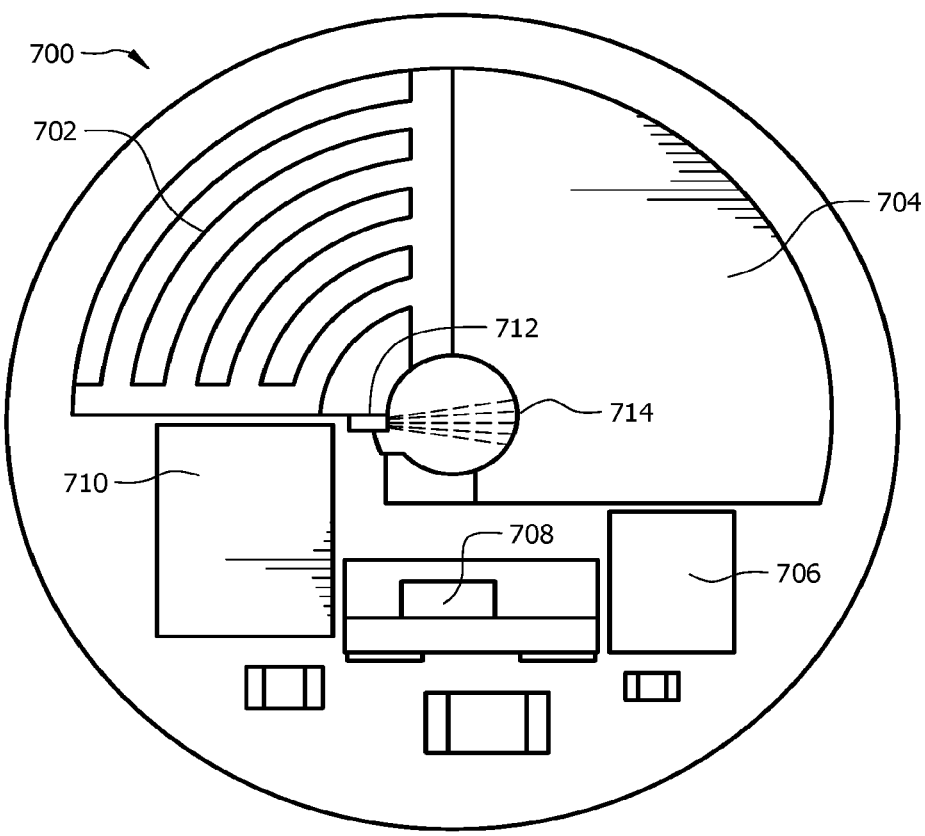
FIG. 7A is a top view of a miniature PM2.5 sensor board assembly according to an embodiment of the disclosure.
Figure 7B:
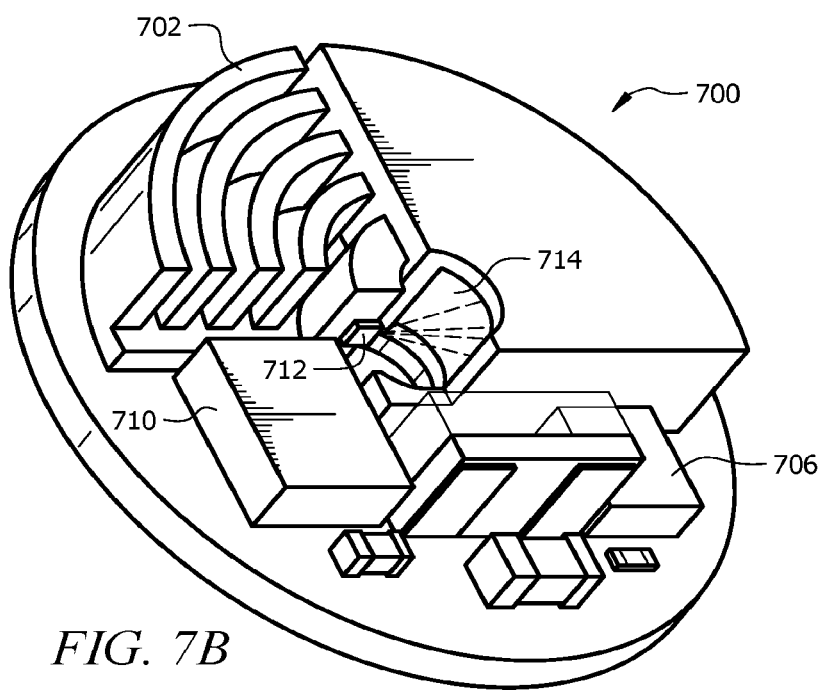
FIG. 7B is a perspective view of a miniature PM2.5 sensor board assembly according to an embodiment of the disclosure.

Turning now to FIGS. 7A and 7B, these figures illustrate an exemplary miniature PM2.5 sensor board assembly 310 shown in FIG. 3 (although this exemplary sensor board assembly is merely one example of a PM sensor element, and other compact/miniature optical sensor elements could also be used in similar fashion). In FIG. 7A, the miniature PM2.5 sensor board assembly 310 may comprise a printed circuit board 700; a laser diode die 712; a photodiode 708; a laser heatsink 702; a laser beam trap 704; a low noise preamplifier 706; and/or a processor 710. FIG. 7B shows a perspective three-dimensional view of the miniature PM2.5 sensor board assembly 310 seen in FIG. 7A. The light source contained in such a miniature PM2.5 sensor board assembly 310 is greatly simplified from existing PM sensors. For example, the laser diode die 712 may have a very small laser beam size (e.g. 2 μm at nominal wavelength 650 nm). Disclosed embodiments of the laser diode die 712 are typically sized to be approximately 0.3 mm in length, 0.25 mm in width, 0.1 mm in height. The footprint of the laser diode die 712 might be 0.075 $mm^2$ or less and/or the three-dimensional (volume) size would be 0.0075 $mm^3$ or less. The laser diode die 712 typically has no associated optical component, such as an optical window or focusing optics, which are bulky and take up much space on the sensor board. The laser diode die 712 beam typically would be used without optically reshaping the beam profile.

For example, in operation, the laser diode die 712 would emit a well-defined output beam profile (e.g. with fixed beam divergence) at the near field close to the laser diode die 712 output area. The output beam or hole 714 (of laser diode die 712) is emitted in a cross path to the path of airflow. In other words, the air flows in the direction through the miniature PM2.5 sensor board assembly 310 (which has an opening/hole/aperture therethrough, for example centrally located and configured to receive the air output stream from the micro membrane pump). For example, the air flows through hole 714 (which typically might be located in the center of the miniature PM2.5 sensor board assembly 310), passes through the wide output beam seen in FIG. 7A inside hole 714, and exits the miniature PM2.5 sensor board assembly 310 (as if perpendicular to the page). Particles can be scattered in any direction as they pass through the wide output beam. Any particles that are scattered and deflected in the direction toward the photodiode 708 will be detected and measured by the photodiode 708 (which may be offset and apart from the beam and oriented toward the beam, e.g., with the line of sight of the sensing face of the photodiode approximately perpendicular to the beam path). Any particles that are scattered in any other direction should be captured by the laser beam trap 704. The laser beam trap 704 may be configured to dump the laser beam to minimize stray light into the detection area. The laser heatsink 702 may be configured to provide thermal management for the laser diode die 712.

In some embodiments, the photodiode 708 is a silicon PIN photodiode with dimensions of approximately 2 mm in length, 1.25 mm in width, and 0.85 mm in height. The footprint of the photodiode 708 might be 2.5 $mm^2$ or less and/or the three-dimensional (volume) size would be 2.125 $mm^3$ or less. Similar to the laser diode die 712, the photodiode 708 may be used without any collecting or other optics. In an embodiment, the distance between the output beam 714 and the photodiode 708 is a short/close distance of approximately 1.5 mm. Such a short (close) distance over which the photodiode can collect and detect particulate matter for analysis should enable the miniature laser and photodiode to function accurately and reliably as a PM2.5 sensor (for example, even without optics). The short distance permits the photodiode 708 to operate highly efficiently at collecting and detecting PM that is scattered by the output beam.

In some embodiments, the processor 710 and/or circuitry may include a driver for the laser diode die 712, a driver for the actuator 306, and a signal processor to analyze the scattered particle signal that is collected and detected by the photodiode 708. The processor and/or circuitry may also comprise low noise preamplifier for the photodiode.

Figure 8:
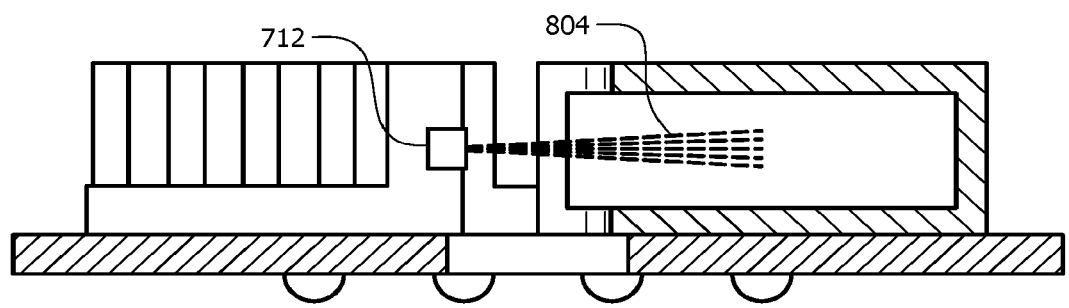
FIG. 8 is a side cross section view of a miniature PM2.5 sensor board assembly according to an embodiment of the disclosure.

FIG. 8 is a cross section view of the miniature PM2.5 sensor board assembly 310 (shown in FIG. 3) as discussed above. A side view of the laser diode die 712 (shown in FIG. 7A) is seen in FIG. 8 emitting a narrow laser beam 804 which may be traveling in the same direction as the airflow path.

In an embodiment, a miniature optical PM sensor module (such as a miniature optical PM2.5 sensor module) is disclosed, for example for use in a cellphone or other portable/mobile wireless device (and it should be recognized that an exemplary compact/miniature optical PM2.5 sensor module is merely one example of a PM sensor module/element, and other compact/miniature optical sensor modules/elements could also be used in similar fashion, such that any reference to PM2.5 sensor hereinafter can refer to that specific sensor as an example or be understood as being used in the description as an example that could similarly allow for other compact/miniature PM sensors in substitution). The miniature optical PM2.5 sensor module typically comprises a housing; a micro airflow generator; an actuator (or driver); a miniature PM2.5 sensor board assembly; and (often) a flex cable assembly (or some other means for mounting/attaching to the mobile phone platform). In an embodiment, a miniature optical PM2.5 sensor module is disclosed wherein the micro airflow generator may comprise a micro membrane pump. In an embodiment, a miniature optical PM2.5 sensor module is disclosed wherein the micro membrane pump may comprise a deformable membrane plate, an air outlet check valve (typically located on the deformable membrane plate), a fixed air inlet plate, and an air inlet check valve (typically located on or with respect to the opening in the fixed air inlet plate). In an embodiment, a miniature optical PM2.5 sensor module is disclosed wherein the actuator may be a MEMS actuator.

In an embodiment, a miniature optical PM2.5 sensor module is disclosed wherein the MEMS actuator may comprise of a cover, a MEMS vertical motion comb drive actuator, a MEMS substrate, and a base plate. In an embodiment, a miniature optical PM2.5 sensor module is disclosed wherein the MEMS actuator may be 6 mm in diameter and 1 mm in height. In an embodiment, a miniature optical PM2.5 sensor module is disclosed wherein the diameter of the fully assembled module may be 7 mm and the height is 3.9 mm. In an embodiment, a miniature optical PM2.5 sensor module is disclosed wherein the MEMS actuator is configured to drive the micro airflow generator.

In another embodiment, a miniature PM2.5 sensor board assembly is more fully disclosed. The miniature PM2.5 sensor board assembly comprises a laser diode die; a photodiode; a laser heatsink; a laser beam trap; a preamplifier; and/or a processor. In an embodiment, a miniature PM2.5 sensor board assembly is disclosed wherein the dimensions of the laser diode die may be no larger than 0.3 mm in length, 0.25 mm in width, and 0.1 mm in height. In an embodiment, a miniature PM2.5 sensor board assembly is disclosed wherein the photodiode may be a silicon PIN photodiode. In an embodiment, a miniature PM2.5 sensor board assembly is disclosed wherein the dimensions of the photodiode may be no larger than 2 mm in length, 1.25 mm in width, and 0.85 mm in height. In an embodiment, a miniature PM2.5 sensor board assembly is disclosed wherein the photodiode is located positionally on the sensor board adjacent to the laser diode die and wherein the photodiode captures light emitted from the laser diode die that is scattered in its direction. In an embodiment, a miniature PM2.5 sensor board assembly is disclosed wherein the laser beam trap captures light emitted from the laser diode die scattered in any other direction. In an embodiment, a miniature PM2.5 sensor board assembly is disclosed wherein the processor may comprise a driver for the laser diode die, a driver for the actuator, and a signal processor for the scattered particle signal.

Having described various devices and methods herein, exemplary embodiments or aspects can include, but are not limited to:

In a first embodiment, a miniature optical particulate matter sensor module may comprise a housing; a micro airflow generator positioned within the housing; an actuator positioned adjacent to the micro airflow generator and configured to drive the micro airflow generator; a miniature particulate matter sensor board assembly in fluid communication with the micro airflow generator; and a flex cable assembly configured to attach to at least one of the housing and the miniature particulate matter sensor board assembly.

A second embodiment can include the sensor module of the first embodiment, wherein the micro airflow generator comprises a micro membrane pump.

A third embodiment can include the sensor module of the second embodiment, wherein the micro membrane pump comprises a deformable membrane plate, an air outlet check valve, an air inlet check valve, and a fixed air inlet plate.

A fourth embodiment can include the sensor module of any of the first through third embodiments, wherein the actuator is a MEMS actuator.

A fifth embodiment can include the sensor module of the fourth embodiment, wherein the MEMS actuator comprises a cover, a MEMS vertical motion comb drive actuator, a MEMS substrate, and a base plate.

A sixth embodiment can include the sensor module of the fourth or fifth embodiments, wherein the MEMS actuator is 6 mm in diameter and 1 mm in height.

A seventh embodiment can include the sensor module of any of the first through sixth embodiments, wherein the miniature particulate matter sensor board assembly comprises a PM2.5 sensor.

An eighth embodiment can include the sensor module of any of the first through seventh embodiments, further comprising a membrane, wherein the actuator drives the membrane, which is configured to generate airflow toward the miniature particulate matter sensor board assembly.

A ninth embodiment can include the sensor module of any of the first through eighth embodiments, wherein the flex cable is configured to provide flexible integration of the miniature optical particulate matter sensor module into space limited mobile assemblies.

A tenth embodiment can include the sensor module of any of the first through ninth embodiments, wherein the flex cable is configured to communicate information from the miniature particulate matter sensor board assembly to a user.

An eleventh embodiment can include the sensor module of the tenth embodiment, wherein the flex cable is configured to attach the miniature particulate matter sensor board assembly to a mobile device.

A twelfth embodiment can include the sensor module of any of the first through eleventh embodiments, wherein the miniature particulate matter sensor board assembly comprises: a printed circuit board; a laser diode die assembled onto the printed circuit board; a photodiode positioned offset and apart from a beam produced by the laser diode die, with a line of sight of a sensing face of the photodiode approximately perpendicular to the beam path; a laser heatsink configured to provide thermal management for the laser diode die; a laser beam trap configured to dump the laser beam to minimize stray light into a detection area; a preamplifier configured to interact with the photodiode; and a processor.

A thirteenth embodiment can include the sensor module of the twelfth embodiment, wherein the photodiode captures light emitted from the laser diode die that is scattered by particulate matter in the airflow passing through the beam produced by the laser diode.

A fourteenth embodiment can include the sensor module of the thirteenth embodiment, wherein the laser beam trap captures light emitted from the laser diode die scattered in any other direction.

A fifteenth embodiment can include the sensor module of any of the twelfth through fourteenth embodiments, wherein the processor comprises a driver for the laser diode die, a driver for the actuator, and a signal processor for the scattered particle signal.

In a sixteenth embodiment, a method for generating airflow via a micro airflow generator within a compact optical scattering particulate matter sensor may comprise providing a miniature optical particulate matter sensor module comprising a housing; a micro airflow generator positioned within the housing; and an actuator positioned adjacent to the micro airflow generator and configured to drive the micro airflow generator; generating airflow into the housing via the actuator; directing the airflow into a miniature particulate matter sensor board assembly in fluid communication with the micro airflow generator; and detecting, by the miniature particulate matter sensor board assembly, particulate matter within the airflow.

A seventeenth embodiment can include the method of the sixteenth embodiment, wherein directing the airflow into a miniature particulate matter sensor board assembly comprising passing the airflow between a light source and a light detector.

An eighteenth embodiment can include the method of the sixteenth or seventeenth embodiments, further comprising producing a laser beam by a laser diode die of the optical scattering particle detection module; and detecting, by a photodiode, light that is scattered by particulate matter passing through the laser beam.

A nineteenth embodiment can include the method of any of the sixteenth through eighteenth embodiments, further comprising applying a force to the actuator, causing movement of the micro airflow generator.

A twentieth embodiment can include the method of any of the sixteenth through nineteenth embodiments, further comprising communicating detected information from the miniature particulate matter sensor board assembly via a flex cable attached to the miniature optical particulate matter sensor module.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A miniature optical particulate matter sensor module comprising:
 a housing;
 a micro airflow generator positioned within the housing;
 an actuator positioned adjacent to the micro airflow generator and configured to drive the micro airflow generator;
 a miniature particulate matter sensor board assembly in fluid communication with the micro airflow generator; and
 a connection assembly comprising direct reflow onto a main circuit board, the connection assembly configured to attach to at least one of the housing and the miniature particulate matter sensor board assembly.

2. The miniature optical particulate matter sensor module of claim 1, wherein the micro airflow generator comprises a micro membrane pump.

3. The miniature optical particulate matter sensor module of claim 2, wherein the micro membrane pump comprises a deformable membrane plate, an air outlet check valve, an air inlet check valve, and a fixed air inlet plate.

4. The miniature optical particulate matter sensor module of claim 1, wherein the actuator is a MEMS actuator.

5. The miniature optical particulate matter sensor module of claim 4, wherein the MEMS actuator comprises a cover, a MEMS vertical motion comb drive actuator, a MEMS substrate, and a base plate.

6. The miniature optical particulate matter sensor module of claim 4, wherein the MEMS actuator is 6 mm in diameter and 1 mm in height.

7. The miniature optical particulate matter sensor module of claim 1, wherein the miniature particulate matter sensor board assembly comprises a PM2.5 sensor.

8. The miniature optical particulate matter sensor module of claim 1, further comprising a membrane, wherein the actuator drives the membrane, which is configured to generate airflow toward the miniature particulate matter sensor board assembly.

9. The miniature optical particulate matter sensor module of claim 1, wherein the connection assembly is configured to provide integration of the miniature optical particulate matter sensor module into space limited mobile assemblies.

10. The miniature optical particulate matter sensor module of claim 1, wherein the connection assembly is configured to communicate information from the miniature particulate matter sensor board assembly to a user.

11. The miniature optical particulate matter sensor module of claim 9, wherein the connection assembly is configured to attach the miniature particulate matter sensor board assembly to a mobile device.

12. The miniature optical particulate matter sensor module of claim 10, wherein the miniature particulate matter sensor board assembly comprises:
 a printed circuit board;
 a laser diode die assembled onto the printed circuit board;
 a photodiode positioned offset and apart from a beam produced by the laser diode die, with a line of sight of a sensing face of the photodiode approximately perpendicular to a beam path of the beam;
 a laser heatsink configured to provide thermal management for the laser diode die;
 a laser beam trap configured to dump the beam to minimize stray light into a detection area;
 a preamplifier configured to interact with the photodiode; and
 a processor.

13. The miniature optical particulate matter sensor module of claim 12, wherein the photodiode captures light emitted from the laser diode die that is scattered by particulate matter in the airflow passing through the beam produced by the laser diode die.

14. The miniature optical particulate matter sensor module of claim 13, wherein the laser beam trap captures light emitted from the laser diode die scattered in any other direction.

15. The miniature optical particulate matter sensor module of claim 13, wherein the processor comprises a driver for the laser diode die, a driver for the actuator, and a signal processor for a scattered particle signal.

16. A method for generating airflow via a micro airflow generator within a compact optical scattering particulate matter sensor, the method comprising:
 providing a miniature optical particulate matter sensor module comprising:
 a housing;
 a micro airflow generator positioned within the housing; and
 an actuator positioned adjacent to the micro airflow generator and configured to drive the micro airflow generator;
 generating airflow into the housing via the actuator;
 directing the airflow into a miniature particulate matter sensor board assembly in fluid communication with the micro airflow generator;
 detecting, by the miniature particulate matter sensor board assembly, particulate matter within the airflow; and
 communicating detected information from the miniature particulate matter sensor board assembly via a connection assembly comprising direct reflow onto a main circuit board, the connection assembly configured to attach to the miniature optical particulate matter sensor module.

17. The method of claim 16, wherein directing the airflow into the miniature particulate matter sensor board assembly comprises passing the airflow between a light source and a light detector.

18. The method of claim 16, further comprising producing a laser beam by a laser diode die of the compact optical scattering particulate matter sensor; and detecting, by a photodiode, light that is scattered by particulate matter passing through the laser beam.

19. The method of claim 16, further comprising applying a force to the actuator, causing movement of the micro airflow generator.

* * * * *